United States Patent
Tajima

(10) Patent No.: US 11,495,614 B2
(45) Date of Patent: Nov. 8, 2022

(54) NON-VOLATILE SEMICONDUCTOR MEMORY DEVICE

(71) Applicant: KIOXIA CORPORATION, Tokyo (JP)

(72) Inventor: Hikari Tajima, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 252 days.

(21) Appl. No.: 17/006,617

(22) Filed: Aug. 28, 2020

(65) Prior Publication Data
US 2021/0296353 A1 Sep. 23, 2021

(30) Foreign Application Priority Data
Mar. 18, 2020 (JP) .............................. JP2020-047910

(51) Int. Cl.
 *H01L 27/11582* (2017.01)
 *H01L 27/11565* (2017.01)
 *H01L 21/285* (2006.01)

(52) U.S. Cl.
 CPC .. *H01L 27/11582* (2013.01); *H01L 27/11565* (2013.01); *H01L 21/28568* (2013.01)

(58) Field of Classification Search
 CPC ................................................ H01L 27/11582
 See application file for complete search history.

(56) References Cited

U.S. PATENT DOCUMENTS

| | | | |
|---|---|---|---|
| 8,450,714 B2 | 5/2013 | Yasutake | |
| 10,361,213 B2 | 7/2019 | Sharangpani et al. | |
| 10,566,280 B2 | 2/2020 | Wakatsuki et al. | |
| 2019/0279932 A1* | 9/2019 | Wakatsuki | ........ H01L 21/28562 |
| 2019/0287982 A1* | 9/2019 | Hinoue | ............. H01L 27/11529 |

FOREIGN PATENT DOCUMENTS

| | | |
|---|---|---|
| JP | 2004311470 A | 11/2004 |
| JP | 2008010634 A | 1/2008 |
| JP | 2008294103 A | 12/2008 |
| JP | 2016001699 A | 1/2016 |
| JP | 2019160918 A | 9/2019 |

* cited by examiner

*Primary Examiner* — Christopher A Johnson
(74) *Attorney, Agent, or Firm* — Kim & Stewart LLP

(57) ABSTRACT

According to one or more embodiments, a non-volatile semiconductor memory device includes a semiconductor region, a gate electrode, a charge storage layer, a first insulating layer, a second insulating layers, and a conductive layer. The conductive layer contains titanium (Ti), aluminum (Al) and nitrogen (N) and has a structure in which a plurality of first layers and a plurality of second layers are alternately provided in a thickness direction. Each first layer contains titanium and nitrogen. Each second layer contains aluminum and nitrogen. In the conductive layer, the ratio of aluminum atomic composition to the sum of the titanium atomic composition and the aluminum atomic composition is equal to or less than 50%.

20 Claims, 9 Drawing Sheets

NON-VOLATILE SEMICONDUCTOR MEMORY DEVICE

CROSS-REFERENCE TO RELATED APPLICATION(S)

This application is based upon and claims the benefit of priority from Japanese Patent Application No. 2020-047910, filed Mar. 18, 2020, the entire contents of which are incorporated herein by reference.

FIELD

Embodiments described herein relate generally to a non-volatile semiconductor memory device.

BACKGROUND

To prevent diffusion of impurities from a gate electrode is of importance in a NAND-type non-volatile semiconductor memory device.

DETAILED DESCRIPTION

Embodiments limit diffusion of impurities from a gate electrode in a non-volatile semiconductor memory device.

According to one or more embodiments, a non-volatile semiconductor memory device comprises a semiconductor region and a gate electrode. A charge storage layer is provided between the semiconductor region and the gate electrode. A first insulating layer is provided between the semiconductor region and the charge storage layer. A second insulating layer is provided between the gate electrode and the charge storage layer. Additionally, a conductive layer is provided between the gate electrode and the second insulating layer. The conductive layer contains titanium (Ti), aluminum (Al) and nitrogen (N) and has a structure in which a plurality of first layers and a plurality of second layers are alternately stacked in a thickness direction. Each of the first layers contains titanium (Ti) and nitrogen (N). Each of the second layers contains aluminum (Al) and nitrogen (N). A ratio between the amount of aluminum (atomic composition) in the conductive layer to a sum of the amount of titanium (atomic composition) in the conductive layer and the amount of aluminum (atomic composition in the conductive layer is equal to or less than 50%.

Embodiments of the present disclosure will now be described with reference to the drawings.

Figure 1:
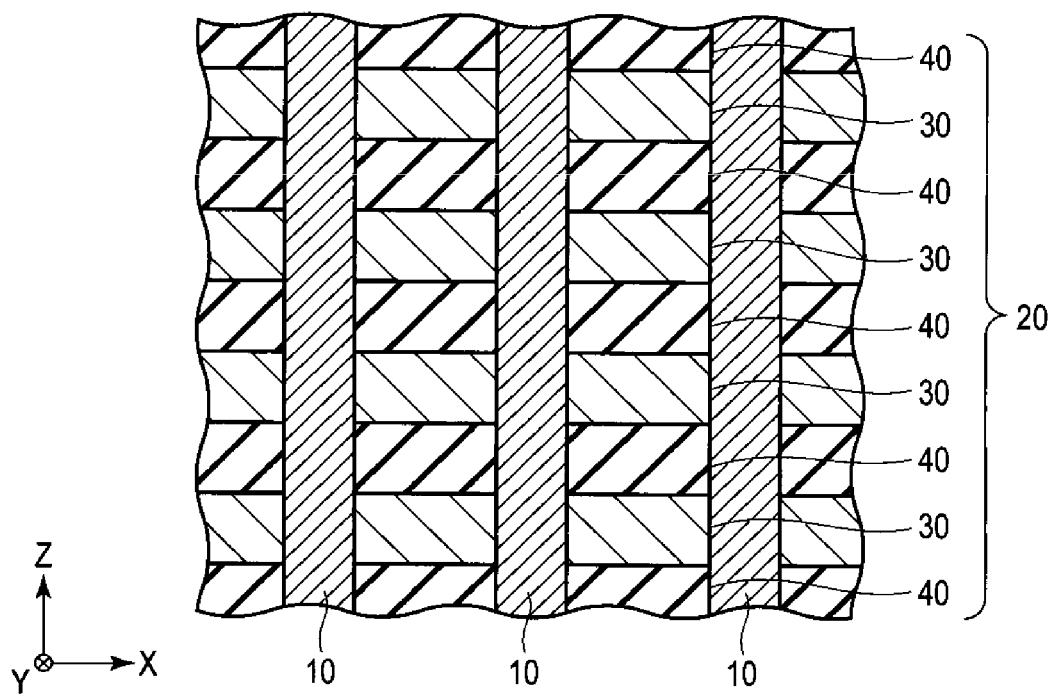
FIG. 1 depicts a non-volatile semiconductor memory device in a schematic cross-sectional view according to an embodiment.
Figure 2:
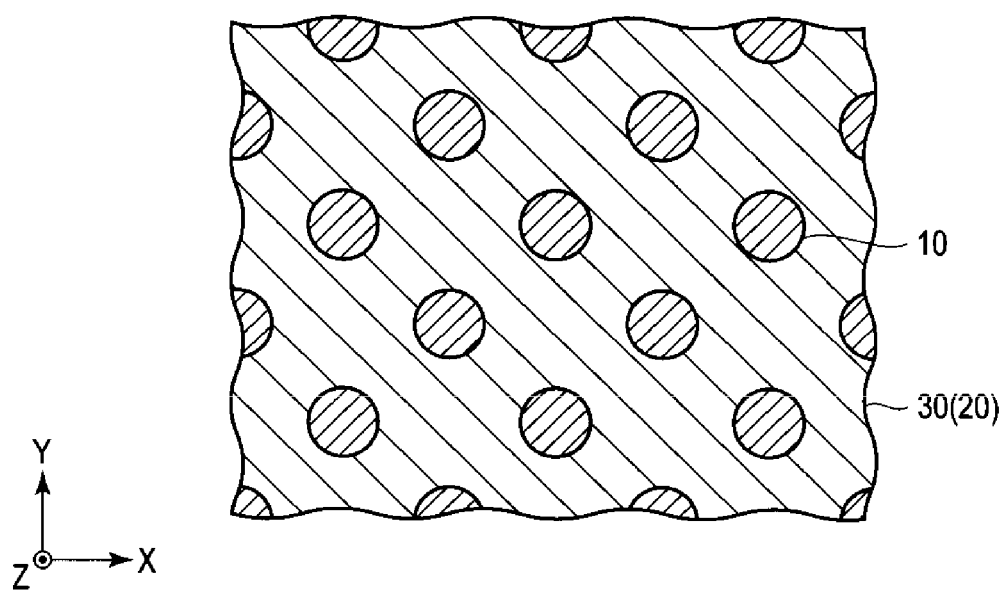
FIG. 2 depicts a non-volatile semiconductor memory device in a schematic cross-sectional view according to an embodiment.

FIGS. 1 and 2 are cross-sectional views schematically showing the configuration of a non-volatile semiconductor memory device according to an embodiment. In FIGS. 1 and 2, the X direction, the Y direction and the Z direction are perpendicular to each other. FIG. 1 is a cross-sectional view perpendicular to the Y direction, and FIG. 2 is a cross-sectional view perpendicular to the Z direction.

The non-volatile semiconductor memory device according to the present embodiment is a NAND-type non-volatile semiconductor memory device having a three-dimensional structure. The non-volatile semiconductor memory device according to the present embodiment comprises a plurality of columnar structures 10 extending in the Z direction (may also be referred to as a first direction herein) and a stacked structure 20 surrounding the columnar structures 10. The stacked structure 20 comprises a plurality of first structural portions 30 and a plurality of second structural portions 40 alternately stacked on each other. Each of the first structural portions 30 includes a conductive layer. Each of the second structural portions 40 includes an insulating layer. One columnar structure 10 and one first structural portion 30 constitute one memory cell, and a plurality of memory cells provided in the Z direction constitute a NAND string.

Figure 3:
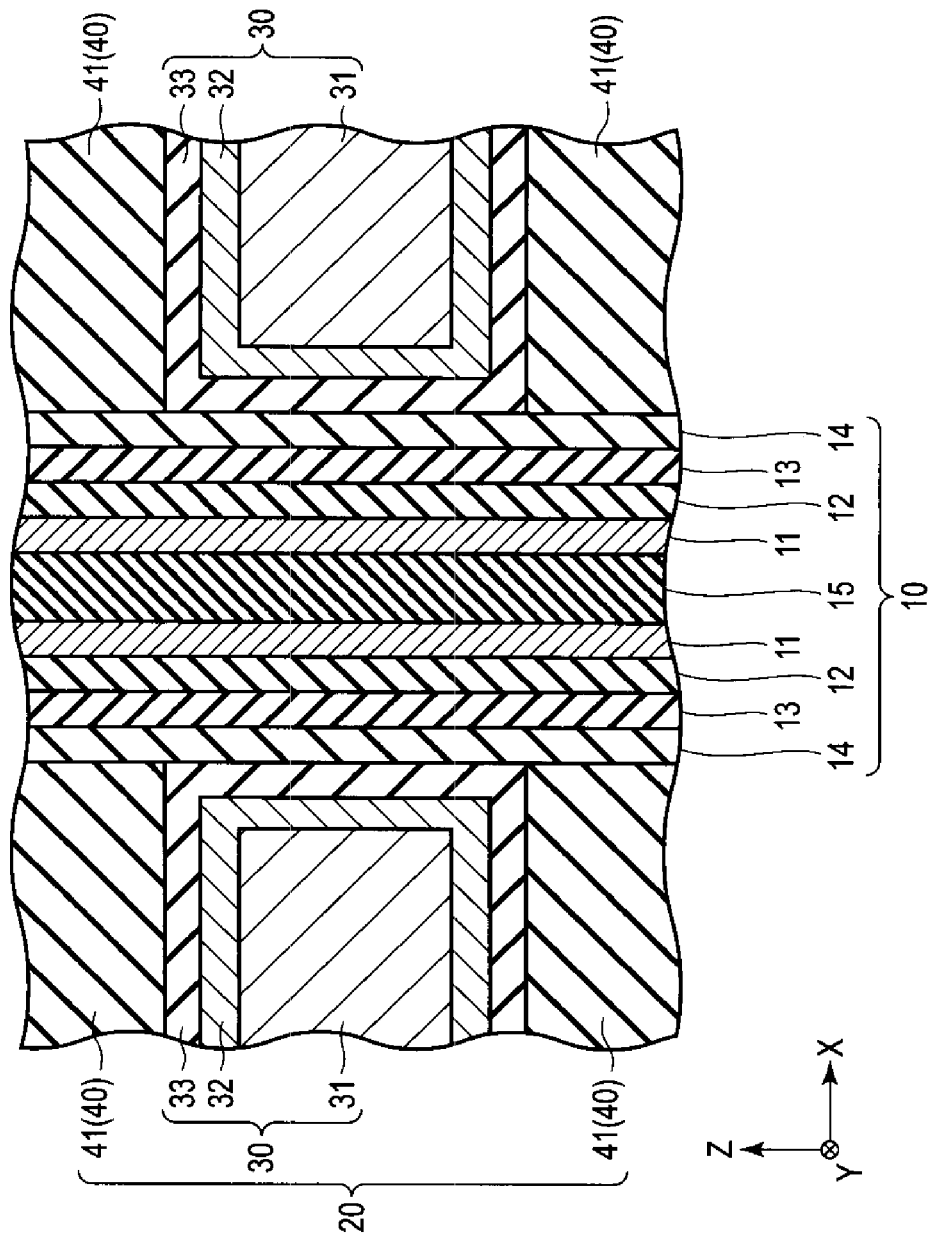
FIG. 3 depicts a non-volatile semiconductor memory device in a schematic cross-sectional view according to an embodiment.
Figure 4:
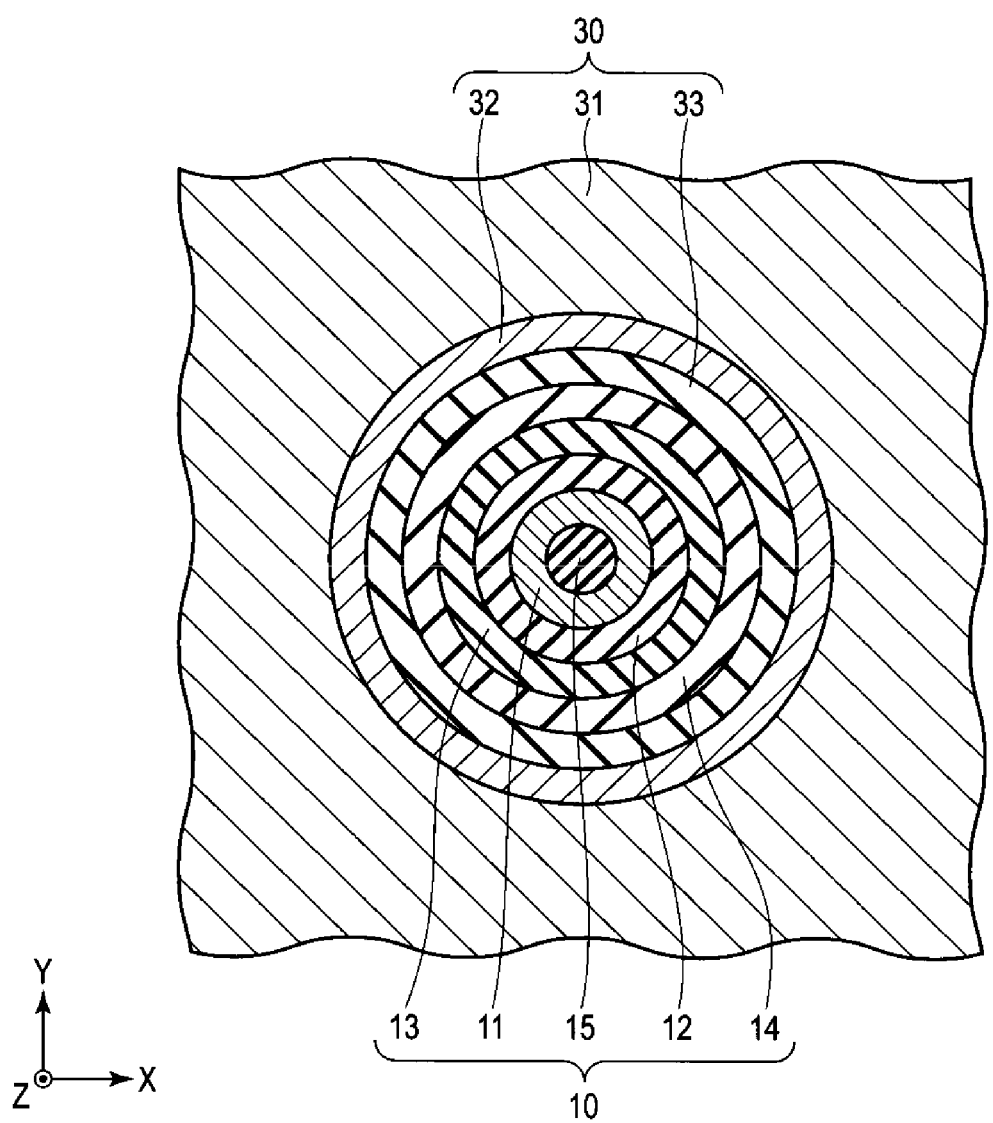
FIG. 4 depicts a non-volatile semiconductor memory device in a schematic cross-sectional view according to an embodiment.

FIGS. 3 and 4 are cross-sectional views showing details of parts of the configurations of the non-volatile semiconductor memory device, shown in FIGS. 1 and 2, respectively. FIG. 3 is a cross-sectional view perpendicular to the Y direction, and FIG. 4 is a cross-sectional view perpendicular to the Z direction.

Each columnar structure 10 includes a semiconductor layer (may also be referred to as a semiconductor region herein) 11, a tunnel insulating layer 12 (may also be referred to as a first insulating layer herein), a charge storage layer (may also be referred to as a charge trapping layer herein) 13, a first block insulating layer portion 14 of a block insulating layer, and a core insulating layer 15. The semiconductor layer 11, the tunnel insulating layer (or the first insulating layer) 12, the charge storage layer 13, and the first block insulating layer portion 14 all have a cylindrical shape, while the core insulating layer 15 has a columnar shape.

In each columnar structure 10, the core insulating layer 15 is provided inside the cylindrically shaped semiconductor layer 11. The semiconductor layer 11 is provided inside the cylindrically shaped tunnel insulating layer 12. The tunnel insulating layer 12 is provided inside the cylindrically shaped charge storage layer 13. The charge storage layer 13 is provided inside the cylindrically shaped first block insulating layer portion 14.

In one embodiment, the semiconductor layer 11 is formed of silicon, the tunnel insulating layer 12 is formed of silicon oxide, the charge storage layer 13 is formed of silicon nitride or silicon oxynitride, the first block insulating layer portion 14 is formed of silicon oxide, and the core insulating layer 15 is formed of silicon oxide.

Each of the first structural portions 30 of the stacked structure 20 has a flat plate-like shape and includes a gate electrode 31, a barrier metal layer 32, and a second block insulating layer portion 33 of the block insulating layer. In each first structural portion 30, the gate electrode 31 is provided inside the barrier metal layer 32. The barrier metal layer 32 is provided inside the second block insulating layer portion 33. In one embodiment, the gate electrode 31 is formed of a metal (e.g., tungsten (W)), the barrier metal layer 32 is a layer containing titanium (Ti), aluminum (Al) and nitrogen (N) (may also be referred to as a TiAlN layer herein), and the second block insulating layer portion 33 is formed of aluminum oxide.

Each of the second structural portions 40 of the stacked structure 20 has a flat plate-like shape and includes an insulating layer 41. The insulating layer 41 is, for example, formed of silicon oxide.

The positional relationships between the elements of the columnar structures 10 and the stacked structure 20 according to the present embodiment can be described as follows: the charge storage layer 13 is provided between the semiconductor layer 11 and the gate electrode 31; the tunnel insulating layer 12 is provided between the semiconductor layer 11 and the charge storage layer 13; the block insulating layer comprising the first and second block insulating layer portions 14 and 33) is provided between the gate electrode 31 and the charge storage layer 13; and the barrier metal layer 32 is provided between the gate electrode 31 and the block insulating layer that comprises the first and second block insulating layer portions 14 and 33.

The barrier metal layer 32 will now be described in further detail. As described above, the barrier metal layer 32 according to the present embodiment is a TiAlN layer containing titanium (Ti), aluminum (Al) and nitrogen (N). The barrier metal layer 32 generally may further contain fluorine (F) and/or oxygen (O).

Figure 5:
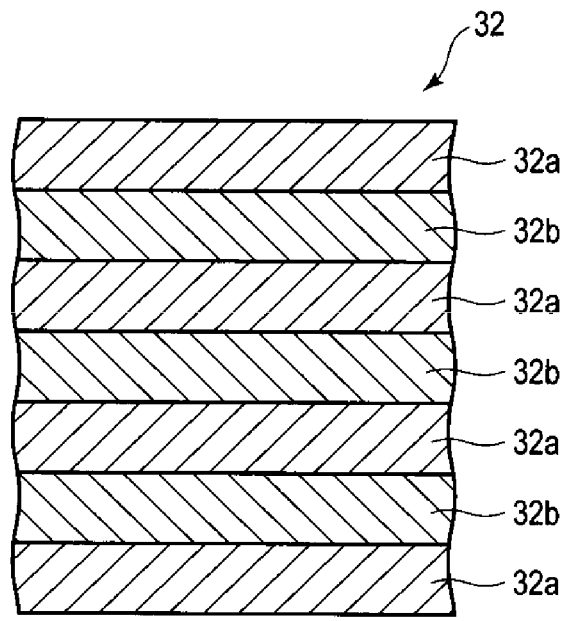
FIG. 5 depicts a barrier metal layer in a non-volatile semiconductor memory device in a schematic cross-sectional view according to an embodiment.

FIG. 5 is a cross-sectional view schematically showing the detailed configuration of the barrier metal layer (TiAlN layer) 32.

As shown in FIG. 5, the barrier metal layer 32 has a structure in which a plurality of first layers 32a and a plurality of second layers 32b are alternately provided or alternately stacked in the thickness direction (may also be referred to as a stacking direction herein). Each of the first layers 32a is a layer containing titanium (Ti) and nitrogen (N) (may also be referred to as a TiN layer herein). Each of the second layers 32b is a layer containing aluminum (Al) and nitrogen (N) (may also be referred to as an AlN layer herein). An Atomic Layer Deposition (ALD) method, for example, may be used for the formation of the barrier metal layer 32. The barrier metal layer 32 may be formed by alternately forming the first layers 32a (e.g., TiN layers) and the second layers 32b (e.g., AlN layers) by an ALD method. The barrier metal layer 32 may function as the conductive layer, or a part thereof, provided between the gate electrode 31 and the second block insulating layer portion 33 of the block insulating layer.

According to the present embodiment, in the entire barrier metal layer 32, the overall proportion of the compositional ratio of aluminum (Al) to the sum of the compositional ratio of titanium (Ti) and the compositional ratio of aluminum (Al) is equal to or less than 50%. In other words, $N2/(N1+N2) \leq 0.5$, when N1 is the number of titanium (Ti) atoms contained in the entire barrier metal layer 32 and N2 is the number of aluminum (Al) atoms contained in the entire barrier metal layer 32. In some examples, the ratio of the atomic compositional ratio of nitrogen (N) to the sum of the atomic compositional ratio of titanium (Ti), the atomic compositional ratio of aluminum (Al) and the atomic compositional ratio of nitrogen (N) in the entire barrier metal layer 32 may be equal to or less than 50%. In other words, $N3/(N1+N2+N3) \leq 0.5$, when N1 and N2 again have the above-defined meanings and N3 is the number of nitrogen atoms contained in the entire barrier metal layer 32. In some examples, $N3/(N1+N2+N3)$ is preferably equal to 0.5.

Each first layer 32a is composed of one or more atomic layers, and each second layer 32b is composed of one or more atomic layers. Each first layer 32a may be composed of either an atomic monolayer or two or more atomic layers. Each second layer 32b may be composed of either an atomic monolayer or two or more atomic layers.

Figure 6:
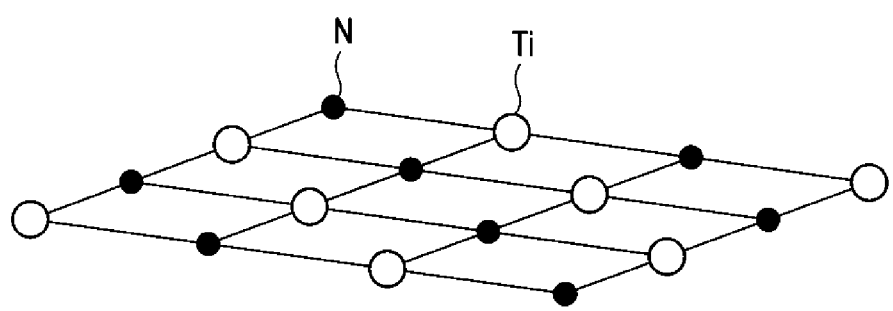
FIG. 6 depicts an atomic monolayer of a first layer of a barrier metal layer in a non-volatile semiconductor memory device according to an embodiment.

FIG. 6 is a diagram schematically showing an atomic monolayer of the first layer (TiN layer) 32a according to one embodiment. As shown in FIG. 6, the atomic monolayer of the first layer (TiN layer) 32a is comprised of a one-layer lattice composed of Ti atoms and N atoms. The ratio between the number of Ti atoms and the number of N atoms in the atomic monolayer is 1:1.

Figure 7:
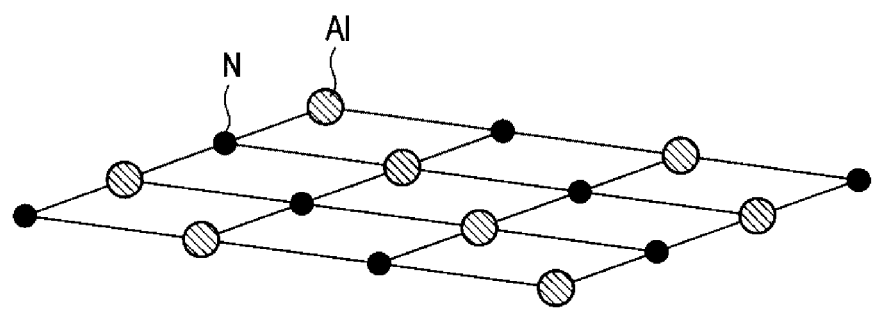
FIG. 7 depicts an atomic monolayer of a second layer of a barrier metal layer in a non-volatile semiconductor memory device according to an embodiment.

FIG. 7 is a diagram schematically showing an atomic monolayer of the second layer (AlN layer) 32b according to one embodiment. As shown in FIG. 7, the atomic monolayer of the second layer (AlN layer) 32b is comprised of a one-layer lattice composed of Al atoms and N atoms. The ratio between the number of Al atoms and the number of N atoms in the atomic monolayer is 1:1.

Figure 8:
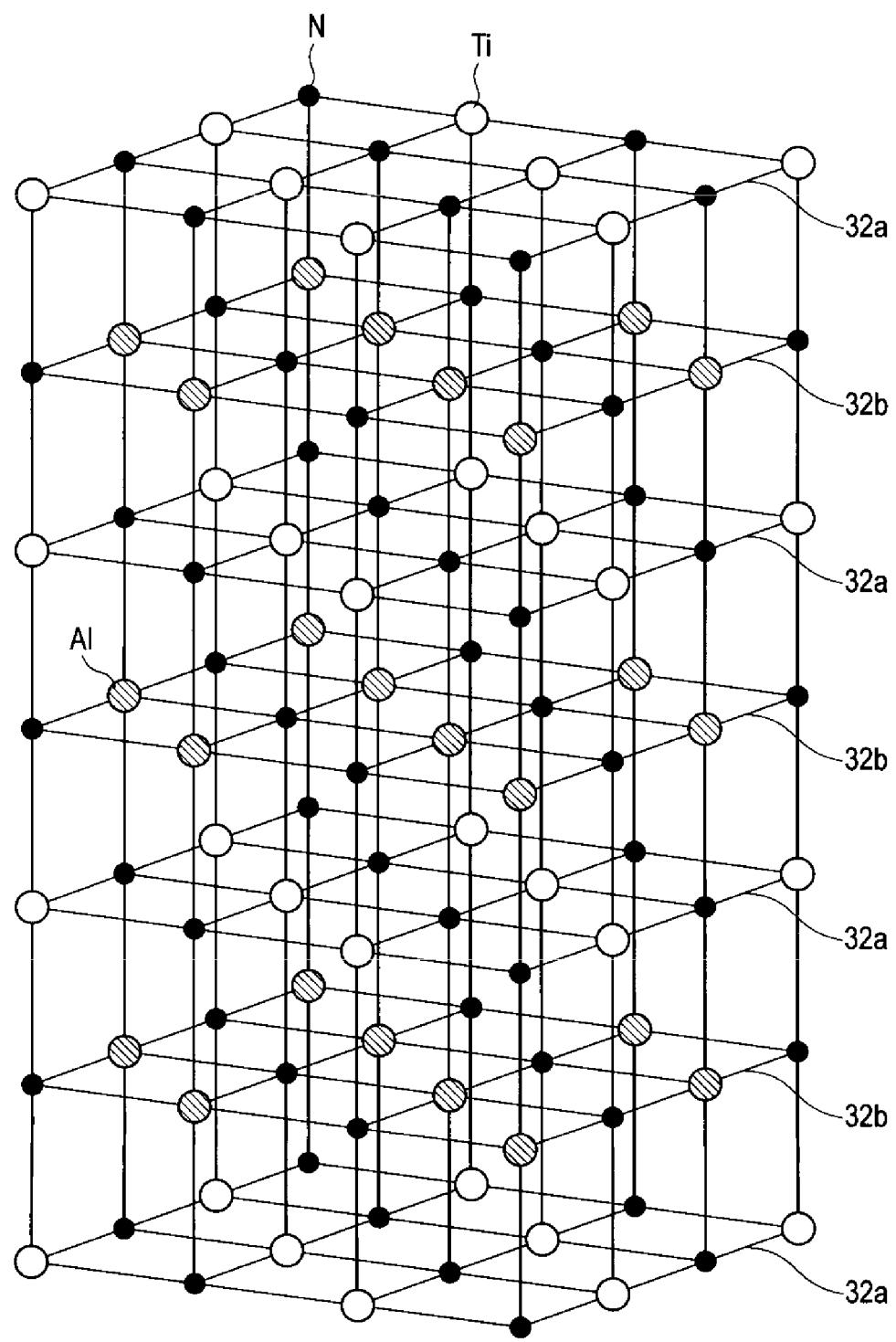
FIG. 8 depicts an example of a barrier metal layer in a non-volatile semiconductor memory device according to an embodiment.

FIG. 8 is a diagram schematically showing the configuration of the barrier metal layer 32 when each of the first layers (TiN layers) 32a is composed of an atomic monolayer, and each of the second layers (AlN layers) 32b is composed of an atomic monolayer according to one embodiment.

As shown in FIGS. 5 and 8, the lowermost layer (that is the closest layer to the gate electrode 31) of the barrier metal layer 32 be a first layer (TiN layer) 32a, and the uppermost layer (that is the farthest layer from the gate electrode 31) of the barrier metal layer 32 also be a first layer (TiN layer) 32a. In general, this a preferred configuration, but may be varied in some examples.

In the present embodiment, the barrier metal layer 32 has a structure in which the first layers 32a and the second layers 32b are alternately provided. Furthermore, in the barrier metal layer 32, the ratio of the atomic compositional ratio of aluminum (Al) to the sum of the atomic compositional ratio of titanium (Ti) and the atomic compositional ratio of aluminum (Al) is equal to or less than 500. Such configuration enables an enhancement of the barrier properties of the barrier metal layer 32. Accordingly, it becomes possible to prevent or effectively mitigate diffusion of impurities from the gate electrode 31.

In the NAND-type non-volatile semiconductor memory device having a three-dimensional structure, the gate electrode 31 (which in this example functions as a word line) is formed by a replacement process. For example, the gate electrode 31 is formed by first forming a sacrificial layer in an area where the gate electrode 31 is to be disposed, then removing the sacrificial layer, and filling a gate electrode material into the space left by the removal of the sacrificial layer.

For example, in the case where tungsten (W) is to be used as a material for a gate electrode formed by the replacement process, fluorine (F), which is contained in a process gas for forming the tungsten electrode, may enter the tungsten electrode material and then later diffuse from the electrode, possibly affecting the properties and the reliability of the memory device.

The use of the barrier metal layer 32 can prevent or limit diffusion of impurities, such as fluorine (F), from the gate electrode 31.

Figure 9:
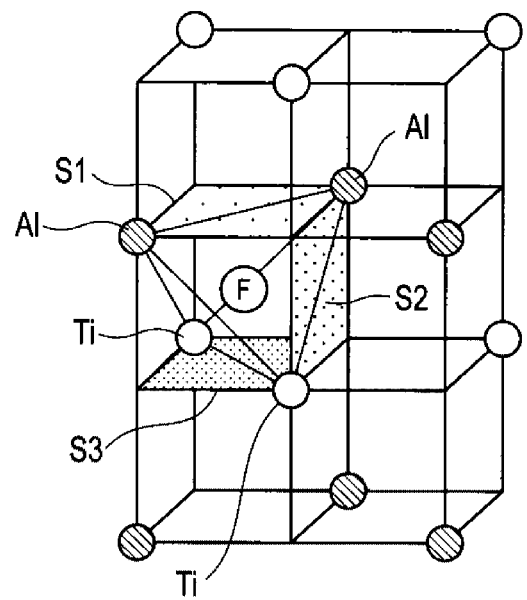
FIG. 9 depicts a fluorine atom which has entered a barrier metal layer in a non-volatile semiconductor memory device according to an embodiment.

FIG. 9 is a diagram schematically illustrating a fluorine atom (F) which has entered the barrier metal layer (TiAlN layer) 32. In the drawing of FIG. 9, nitrogen (N) atoms which are present are not labeled. As shown in FIG. 9, the stable site of a fluorine atom (F) is the position of the center of gravity of a tetrahedron defined by two titanium (Ti) atoms and two aluminum (Al) atoms. On the other hand, a fluorine atom (F) in the transition state may be located at one of a site in a plane S1 defined by two aluminum (Al) atoms, a site in a plane S2 defined by one titanium (Ti) atom and one aluminum (Al) atom, or a site in a plane S3 defined by two titanium (Ti) atoms.

Figure 10:
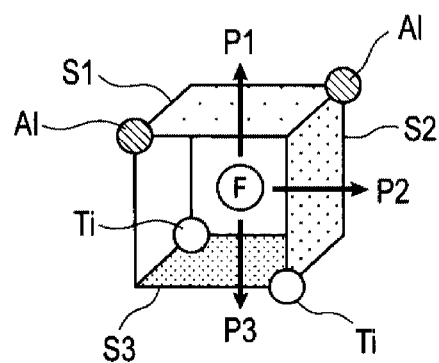
FIG. 10 depicts diffusion paths of a fluorine atom in a barrier metal layer in a non-volatile semiconductor memory device according to an embodiment.

FIG. 10 is a diagram schematically illustrating diffusion paths of a fluorine (F) atom in the barrier metal layer 32, which is a TiAlN layer in this example. A fluorine atom (F) can pass through one of a path P1 (passing through a plane S1 defined by two aluminum (Al) atoms), a path P2 (passing through a plane S2 defined by one titanium (Ti) atom and one aluminum (Al) atom), or a path P3 (passing through a plane S3 defined by two titanium (Ti) atoms).

Figure 11:
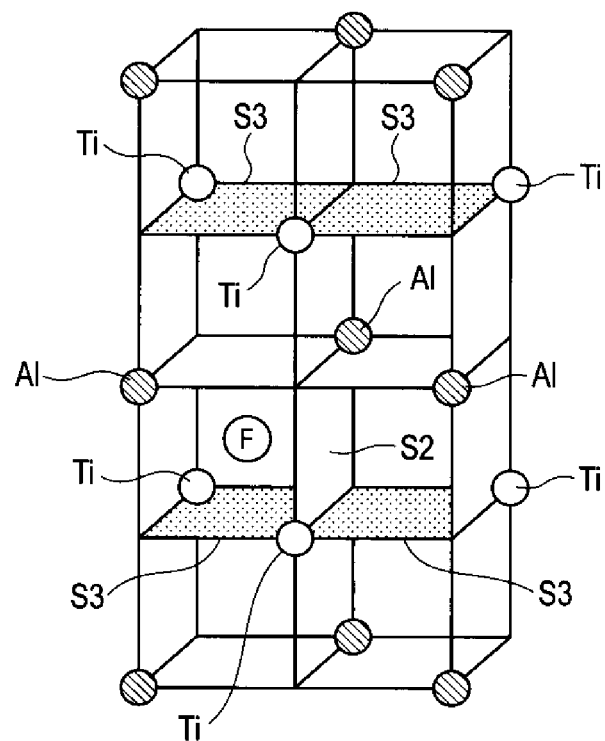
FIG. 11 depicts a fluorine atom which is confined in a barrier metal layer in a non-volatile semiconductor memory device according to an embodiment.

When considering a diffusion barrier for preventing passage (diffusion) of a fluorine (F) atom through the paths P1, P2 or P3, the diffusion barrier when a fluorine (F) atom passes (or diffuses) through the path P1 is 0.9 eV, 0.6 eV for the path P2, and 4.2 eV for the path P3. Thus, the diffusion barrier of the path P3 is significantly higher than those of the paths P1 and P2. It is therefore more difficult for the fluorine (F) atom to pass through the plane S3 than to pass through the planes S1 and S2. Consequently, as shown in FIG. 11, the fluorine (F) atom will generally be confined to a space sandwiched between planes S3.

Figure 12A:
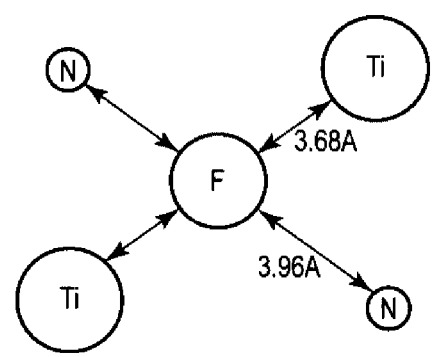
FIG. 12A depicts interatomic distances when a barrier metal layer is a TiN layer according to an embodiment.
Figure 12B:
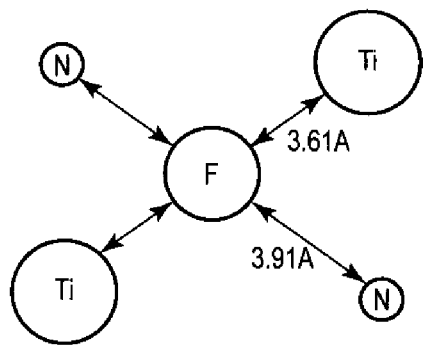
FIG. 12B depicts interatomic distances when a barrier metal layer is a TiAlN layer according to an embodiment.

If the barrier metal layer 32 is formed not as a TiAlN layer but as a TiN layer, any fluorine (F) atom will be surrounded by planes S3 (each plane S3 being defined by two titanium (Ti) atoms) in all directions, and therefore diffusion of the fluorine (F) atom will be prevented more effectively. However, the lattice constant of TiN (4.25 angstroms) is larger than the lattice constant of TiAlN (4.18 angstroms). Hence, as shown in FIGS. 12A and 12B, the interatomic distance between a titanium (Ti) atom and a fluorine (F) atom and the interatomic distance between a nitrogen (N) atom and a fluorine (F) atom are both larger when the barrier metal layer 32 is a TiN layer (FIG. 12A) than when the barrier metal layer 32 is a TiAlN layer (FIG. 12B). Thus, an area that a fluorine (F) atom can pass through is wider when the barrier metal layer 32 is a TiN layer than when the barrier metal layer 32 is a TiAlN layer.

According to the present embodiment, both a higher diffusion barrier and a narrower diffusion area (or passage area) can be achieved by forming the barrier metal layer 32 as a TiAlN layer in which the TiN layers (first layers 32a) and the AlN layers (second layers 32b) are stacked alternately. This makes it possible for the barrier metal layer 32 to more effectively mitigate or prevent diffusion of impurities, such as fluorine (F), from the gate electrode 31.

In the present embodiment, the proportion of the atomic compositional ratio (atomic composition) of aluminum (Al) to the sum of the atomic compositional ratio (atomic composition) of titanium (Ti) and the atomic compositional ratio (atomic composition) of aluminum (Al) in the barrier metal layer 32 is made equal to or less than 50%. Therefore, even if aluminum (Al) enters the first layer (s) 32a (TiN layer), the content of aluminum (Al) in the first layer(s) 32a (TiN layer) can be kept small. It is thus possible to ensure sufficient barrier properties of the first layer(s) 32a (TiN layer).

Further, in the present embodiment, the lowermost layer (that is the closest layer to the gate electrode 31) and the uppermost layer (that is the farthest layer from the gate electrode 31) of the barrier metal layer 32 are both TiN layers (first layers 32a). This makes it possible to more effectively prevent diffusion of impurities, such as fluorine (F), out of the barrier metal layer 32.

Figure 13:
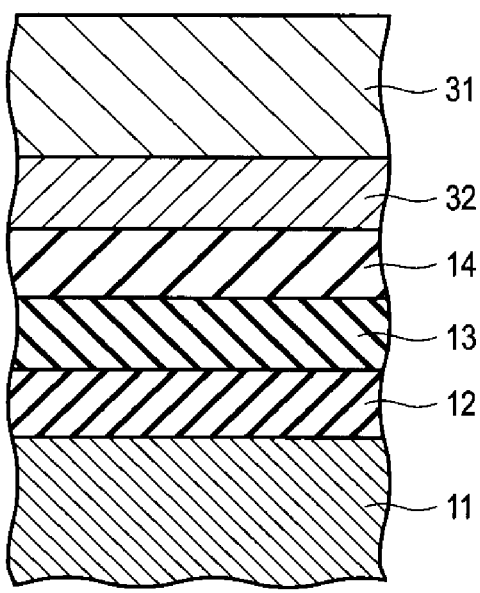
FIG. 13 depicts a non-volatile semiconductor memory device in a schematic cross-sectional view according to a variation of an embodiment.

While the NAND-type non-volatile semiconductor memory device having a three-dimensional structure has been described, the barrier metal layer 32 according to the present embodiment may be applied in a NAND-type non-volatile semiconductor memory device having a two-dimensional structure in which, for example, a tunnel insulating layer 12, a charge storage layer 13, a block insulating layer 14, the barrier metal layer 32 and a gate electrode 31 are formed on the semiconductor layer (may also be referred to as a semiconductor substrate or a semiconductor region) 11 in the order as shown in FIG. 13.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device, comprising:
   a semiconductor region;
   a gate electrode;
   a charge storage layer between the semiconductor region and the gate electrode;
   a first insulating layer between the semiconductor region and the charge storage layer;
   a second insulating layer between the gate electrode and the charge storage layer; and
   a conductive layer between the gate electrode and the second insulating layer, wherein the conductive layer contains titanium, aluminum, and nitrogen and includes a plurality of first layers and a plurality of second layers alternating with each other in a thickness direction, each of the first layers containing titanium and nitrogen, each of the second layers containing aluminum and nitrogen, and a ratio of an atomic composition of aluminum in the conductive layer to a sum of an atomic composition of titanium in the conductive layer and the atomic composition of aluminum in the conductive layer is equal to or less than 50%.

2. The non-volatile semiconductor memory device according to claim 1, wherein
each of the first layers is formed by atomic layer deposition, and
each of the second layers is formed by atomic layer deposition.

3. The non-volatile semiconductor memory device according to claim 1, wherein
each of the first layers is an atomic monolayer, and
each of the second layers is an atomic monolayer.

4. The non-volatile semiconductor memory device according to claim 1, wherein
a lowermost layer of the conductive layer is one of the first layers, and
an upper most layer of the conductive layer is another one of the first layers.

5. The non-volatile semiconductor memory device according to claim 1, wherein the conductive layer further contains fluorine.

6. The non-volatile semiconductor memory device according to claim 1, wherein the conductive layer further contains oxygen.

7. The non-volatile semiconductor memory device according to claim 1, wherein the gate electrode contains fluorine.

8. The non-volatile semiconductor memory device according to claim 1, wherein the gate electrode comprises tungsten.

9. The non-volatile semiconductor memory device according to claim 1, wherein the semiconductor region, the first insulating layer, and the charge storage layer are layered in that order in a columnar structure extending in a first direction.

10. The non-volatile semiconductor memory device according to claim 9, wherein the columnar structure is surrounded by a stacked structure comprising a plurality of first structural portions and a plurality of second structural portions alternately stacked in the first direction, each of the plurality of first structural portions containing a conductive material, each of the plurality of second structural portions containing an insulating material.

11. The non-volatile semiconductor memory device according to claim 10, wherein
the gate electrode and the conductive layer are in each of the plurality of first structural portions, and
the gate electrode is inside the conductive layer in each of the plurality of first structural portions.

12. The non-volatile semiconductor memory device according to claim 10, wherein
the second insulating layer comprises a first portion having a cylindrical shape in the columnar structure, and
the charge storage layer is inside the first portion.

13. The non-volatile semiconductor memory device according to claim 12, wherein
the second insulating layer comprises a second portion in each of the first structural portions, and
the conductive layer is inside the second portion.

14. The non-volatile semiconductor memory device according to claim 1, wherein the non-volatile semiconductor memory device is a NAND-type non-volatile semiconductor memory device.

15. A non-volatile semiconductor memory device, comprising:
a semiconductor region;
a gate electrode;
a charge storage layer between the semiconductor region and the gate electrode;
an insulating layer between the charge storage layer and the gate electrode; and
a conductive layer between the insulating layer and the gate electrode, wherein
the conductive layer is a stacked structure of a plurality of titanium nitride (TiN) layers and a plurality of aluminum nitride (AlN) layers alternately stacked on each other, and
a ratio of an atomic composition of aluminum (Al) in the conductive layer to a sum of atomic compositions of titanium and aluminum in the conductive layer is equal to or less than 50%.

16. The non-volatile semiconductor memory device according to claim 15, wherein a ratio of an atomic composition of nitrogen in the conductive layer to a sum of the atomic compositions of titanium, aluminum, and nitrogen in the conductive layer is equal to or less than 50%.

17. The non-volatile semiconductor memory device according to claim 15, wherein
each of the TiN layers is formed by atomic layer deposition, and
each of the AlN layers is formed by atomic layer deposition.

18. The non-volatile semiconductor memory device according to claim 15, wherein
a lowermost layer of the conductive layer is one of the TiN layers, and
an upper most layer of the conductive layer is another one of the TiN layers.

19. A non-volatile semiconductor memory device, comprising:
a plurality of columnar structures, each extending in a first direction; and
a stacked structure surrounding the plurality of columnar structures and comprising a plurality of first structural portions and a plurality of second structural portions alternatively stacked on each other in the first direction, each of the first structural portions including a conductive layer, each of the second structural portions including an insulating layer, wherein
the plurality of columnar structures and the plurality of first structural portions comprise a plurality of memory cells, and the plurality of memory cells comprise a NAND string, each of the columnar structures comprises:
a core insulating layer having a columnar shape; and
a semiconductor layer, a tunnel insulating layer, a charge storage layer and a block insulating layer layered in that order around the core insulting layer,
each of the first structural portions comprises a gate electrode, and the conductive layer including a barrier metal layer of the first structural portion is between the gate electrode and the block insulating layer of the columnar structure, the barrier metal layer comprising titanium, aluminum and nitrogen, and a ratio of an atomic composition of aluminum in the barrier metal layer to a sum of atomic compositions of titanium and aluminum in the barrier metal layer is equal to or less than 50%.

20. The non-volatile semiconductor memory device according to claim 19, wherein the barrier metal layer comprises a plurality of titanium nitride layers and a plurality of aluminum nitride layers alternately stacked on each other in a thickness direction.

* * * * *